United States Patent
An

(10) Patent No.: US 7,352,230 B2
(45) Date of Patent: Apr. 1, 2008

(54) INTERNAL VOLTAGE TRIMMING CIRCUIT FOR USE IN SEMICONDUCTOR MEMORY DEVICE AND METHOD THEREOF

(75) Inventor: Yong-Bok An, Ichon-shi (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 11/015,474

(22) Filed: Dec. 20, 2004

(65) Prior Publication Data

US 2006/0061404 A1    Mar. 23, 2006

(30) Foreign Application Priority Data

Sep. 22, 2004  (KR) .................. 10-2004-0075770

(51) Int. Cl.
*G06G 7/28* (2006.01)
(52) U.S. Cl. ...................... 327/334; 327/525
(58) Field of Classification Search ............. 327/334, 327/525, 526, 538, 539, 540, 541, 542, 543
See application file for complete search history.

(56) References Cited

U.S. PATENT DOCUMENTS

| | | | |
|---|---|---|---|
| 5,459,426 A * | 10/1995 | Hori | 327/332 |
| 5,550,512 A | 8/1996 | Fukahori | 330/254 |
| 6,433,714 B1 | 8/2002 | Clapp et al. | 341/121 |
| 6,909,642 B2 * | 6/2005 | Lehmann et al. | 365/189.09 |
| 6,943,616 B2 * | 9/2005 | Ogawa et al. | 327/538 |
| 2004/0108882 A1 * | 6/2004 | Abe | 327/525 |
| 2004/0246045 A1 * | 12/2004 | Lim et al. | 327/540 |

FOREIGN PATENT DOCUMENTS

| | | |
|---|---|---|
| JP | 2001-093296 | 4/2001 |
| KR | 1020010059286 | 7/2001 |

* cited by examiner

*Primary Examiner*—Quan Tra
*Assistant Examiner*—Khareem E Almo
(74) *Attorney, Agent, or Firm*—Lowe Hauptman Ham & Berner LLP

(57) ABSTRACT

An internal power voltage trimming circuit and its method individually or simultaneously perform level trimming for a plurality of power voltages in a semiconductor memory device. The internal power voltage trimming circuit includes a trimming control signal generator for generating a trimming selection signal and a trimming enable signal by using an inputted address signal, and an internal power voltage level controller for controlling the levels of the internal power voltages by using the trimming selection signal that is outputted under control of the trimming enable signal.

28 Claims, 6 Drawing Sheets

INTERNAL VOLTAGE TRIMMING CIRCUIT FOR USE IN SEMICONDUCTOR MEMORY DEVICE AND METHOD THEREOF

FIELD OF INVENTION

The present invention relates to a semiconductor memory device; and, more particularly, to an internal voltage trimming circuit for use in a semiconductor memory device and a method thereof.

DESCRIPTION OF PRIOR ART

In order to reduce current consumption as well as increase operation speed in a semiconductor memory device such as DRAM, a driving voltage has been decreased. From this, a power voltage generator for shifting a power voltage that is applied to the semiconductor memory device to a predetermined level becomes much more important. The power voltage generator generates a first driving voltage VPP for enabling word-lines(WL) of the semiconductor memory device, for example, by using an inputted power voltage VDD. Here, the first driving voltage VPP is higher than the power voltage VDD. On Further, the power voltage generator generates a second driving voltage VBB to apply a bulk bias to NMOS transistors.

On the other hand, the first or second driving voltage from the internal power voltage generator could be higher or lower than a set value depending on environment or condition during manufacturing process of the semiconductor memory device. Such an error can be critical defect in operation of the semiconductor memory device. The error is corrected by fuse cutting depending on variation by using fuse option so as to reduce error. For the fuse cutting, each of the internal power voltages is trimmed to be equal to each of the set values by using a test mode. Then, fuse cutting is performed with selecting a fuse for taking an appropriate level.

On the other hand, when a function test is committed after trimming and fuse cutting, operational condition of the transistor may vary according to manufacture process variation even through the internal power voltages are trimmed as designed. Even there can be insufficient margin in each of the internal power voltages. Further, there can be level discordance between the respective internal power voltages.

FIG. 1 is a block diagram showing a conventional fuse trimming technique, in which a case of two power voltages to be trimmed is exemplified. FIG. 2 is a detailed circuit diagram showing a trimming control signal generating unit shown in FIG. 1. FIG. 3 is a detailed circuit diagram showing an internal voltage level controlling unit shown in FIG. 1.

When the semiconductor memory device enters the test mode, a trimming selection signal generating unit decodes an inputted address A6-A0 to output a trimming selection signal TSS and a trimming enable signal generating unit decodes and latches the inputted address A6-A0 to output a first trimming enable signal TES1 and a second trimming enable signal TES2.

The trimming can be selected among 7 cases by using the trimming selection signal TSS that depends on the address A6-A0. For example, a reference level can be increased by 4 steps or decreased by 3 steps. When one of the 7 cases is selected, the previously selected one is disabled.

The first trimming enable signal TES1 and the second trimming enable signal TES2 are enabled or disabled, independently. In other words, in test mode exit, each of latches for the first trimming enable signal TES1 and the second trimming enable signal TES2 is reset when a "L" signal is inputted to a reset port of each of the latches. Further, in test mode entry, first trimming enable signal TES1 and the second trimming enable signal TES2 can also be enabled, simultaneously.

On the other hand, the trimming selection signal TSS and the trimming enable signals cannot be decoded simultaneously. For example, the trimming selection signal TSS is enabled first, and then the trimming selection signal TSS is disabled when either the first trimming enable signal TES1 or the second trimming enable signal TES2 is enabled. Therefore, the trimming selection signal TSS is enabled after first enabling either the first trimming enable signal TES1 or the second trimming enable signal TES2 that is latched for trimming the level of the voltage.

Here, it is necessary to have 7 signal lines for transferring the trimming selection signal to make it possible to have 7 trimming cases depending on the trimming selection signal TSS. Such lines should be connected globally within the semiconductor memory device. As the number of signal lines increases, the size of the semiconductor memory device increases. Accordingly, an encoder 112 encodes the signals on the 7 lines to reduce to signals on 3 lines. The encoded signals are globally transferred from a trimming controlling unit 1 to an internal power voltage level controlling unit 2 and then decoded in a decoder 22 within the internal power voltage level controlling unit 2. The decoded signal makes a switching transistor of a trimming circuit 23 to output the voltage level to be trimmed.

A fuse controlling unit 21 transfers the encoded signal that is inputted when the trimming enable signal TES is enabled. Further, when the fuse is cut in packaged, cutting information of the fuse is blocked and the trimming selection signal TSS is transferred to the decoder 22. At this point, the number of the lines that are outputted from the decoder is 8 while the number of the trimming selections is 7. This is to leave the power voltage level not trimmed but in trimming waiting state by outputting "L" state from the decoder 22 if the trimming selection signal TSS is not inputted even though the first or second trimming enable signal TES1, TES2 is enabled. As such, one power voltage level can be trimmed.

On the other hand, when the first trimming enable signal TES1 and the second trimming enable signal TES2 are enabled with subsequent test mode entry and trimming is selected based on the trimming selection signal TSS, a number of power voltages can be simultaneously level-trimmed to one step. That is, because a number of power voltages cannot be independently trimmed, there is no way to know difference depending on level changes between the power voltages.

SUMMARY OF INVENTION

It is, therefore, an object of the present invention to provide an internal power voltage trimming circuit capable of individually or simultaneously performing level trimming for a plurality of power voltages in a semiconductor memory device.

It is another object of the present invention to provide an internal power voltage trimming method capable of individually or simultaneously performing level trimming for a plurality of power voltages in a semiconductor memory device.

In accordance with an aspect of the present invention, there is provided an internal power voltage trimming circuit for use in an internal power voltage generating circuit for generating a plurality of internal power voltages, including a trimming control signal generating unit for generating a trimming selection signal and a trimming enable signal by using an inputted address signal, and an internal power voltage level controlling unit for controlling the levels of the internal power voltages by using the trimming selection signal that is outputted under control of the trimming enable signal.

In accordance with another aspect of the present invention, there is provided a internal power voltage trimming method for generating a plurality of internal power voltages, comprising the steps of generating a trimming selection signal and a trimming enable signal by using an inputted address signal, and controlling the levels of the internal power voltages by using the trimming selection signal that is outputted under control of the trimming enable signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an internal power voltage trimming circuit in accordance with the present invention will be described in detail referring to the accompanying drawings.

Figure 1:
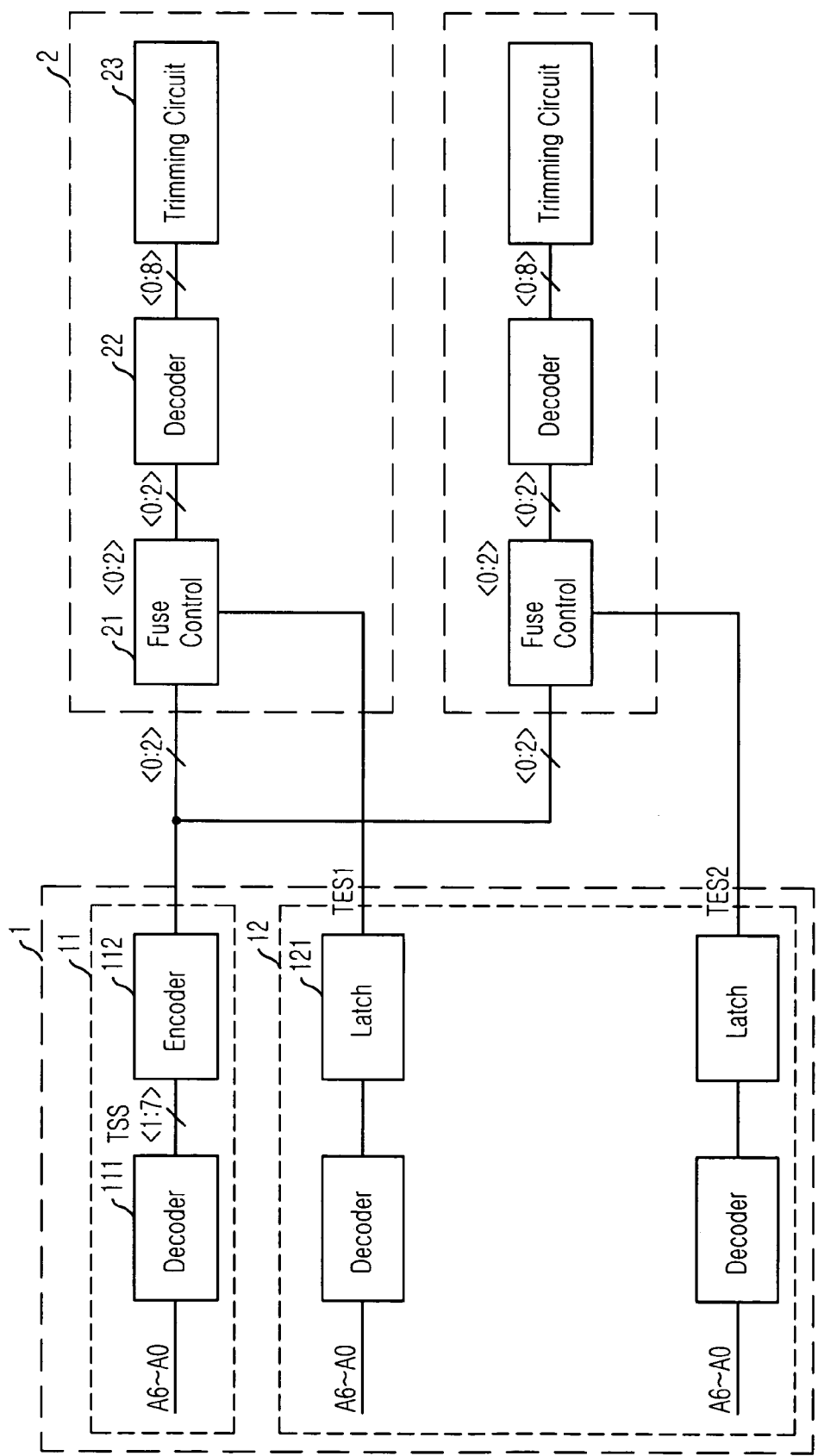
FIG. 1 is a block diagram showing a conventional fuse trimming technique.
Figure 2:
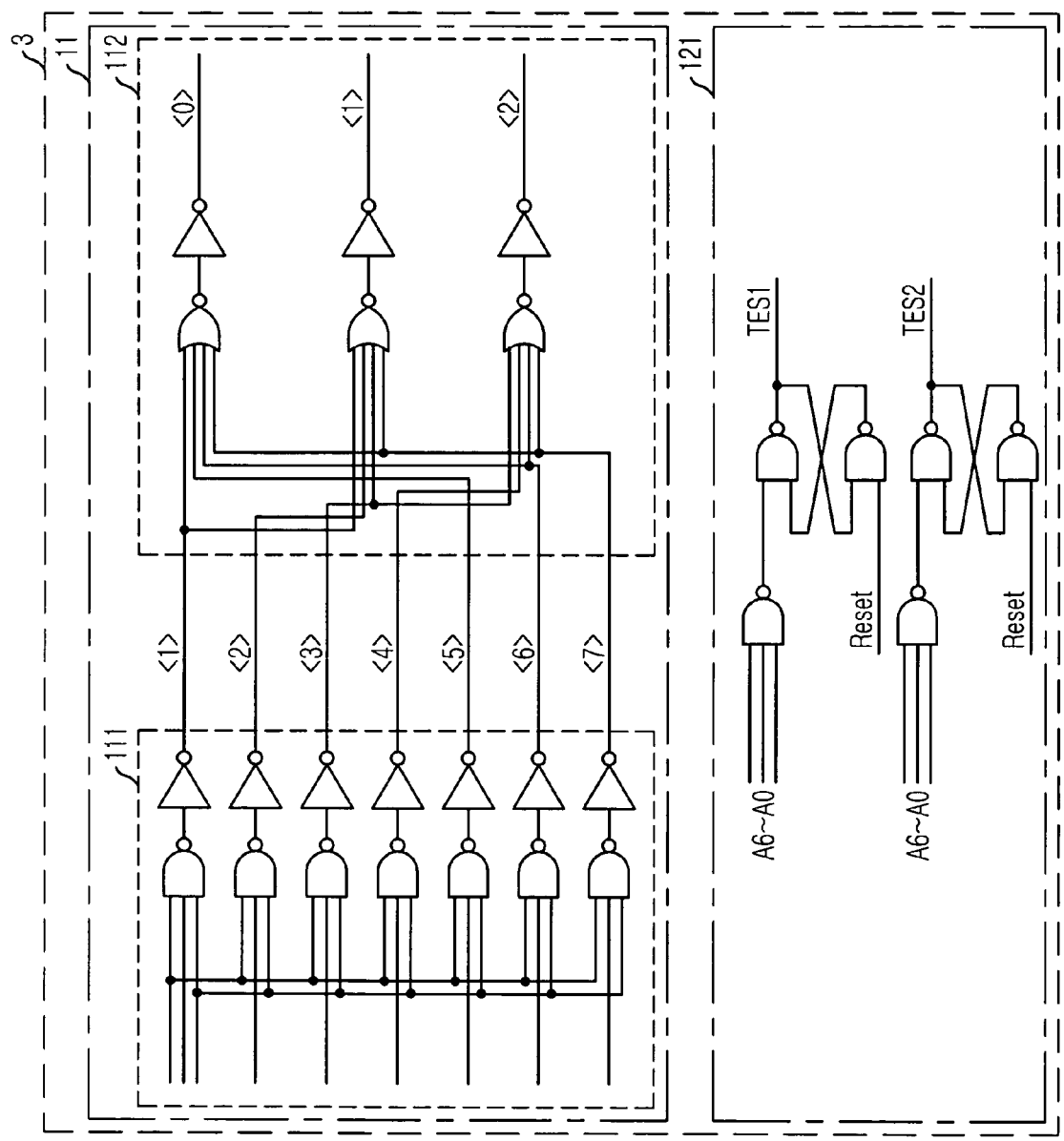
FIG. 2 is a detailed circuit diagram showing a trimming control signal generating unit shown in FIG. 1.
Figure 3:
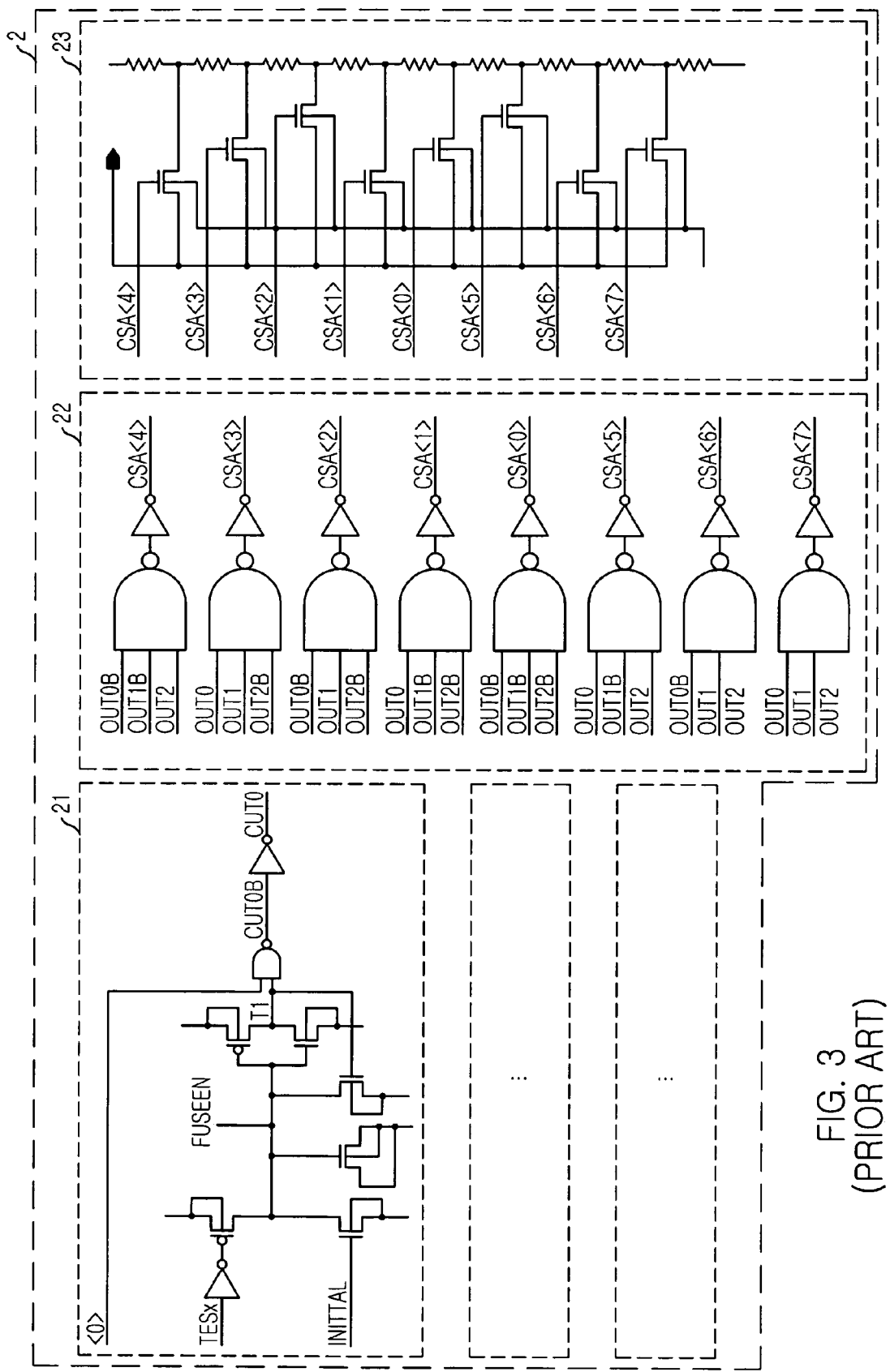
FIG. 3 is a detailed circuit diagram showing an internal voltage level controlling unit shown in FIG. 1.
Figure 4:
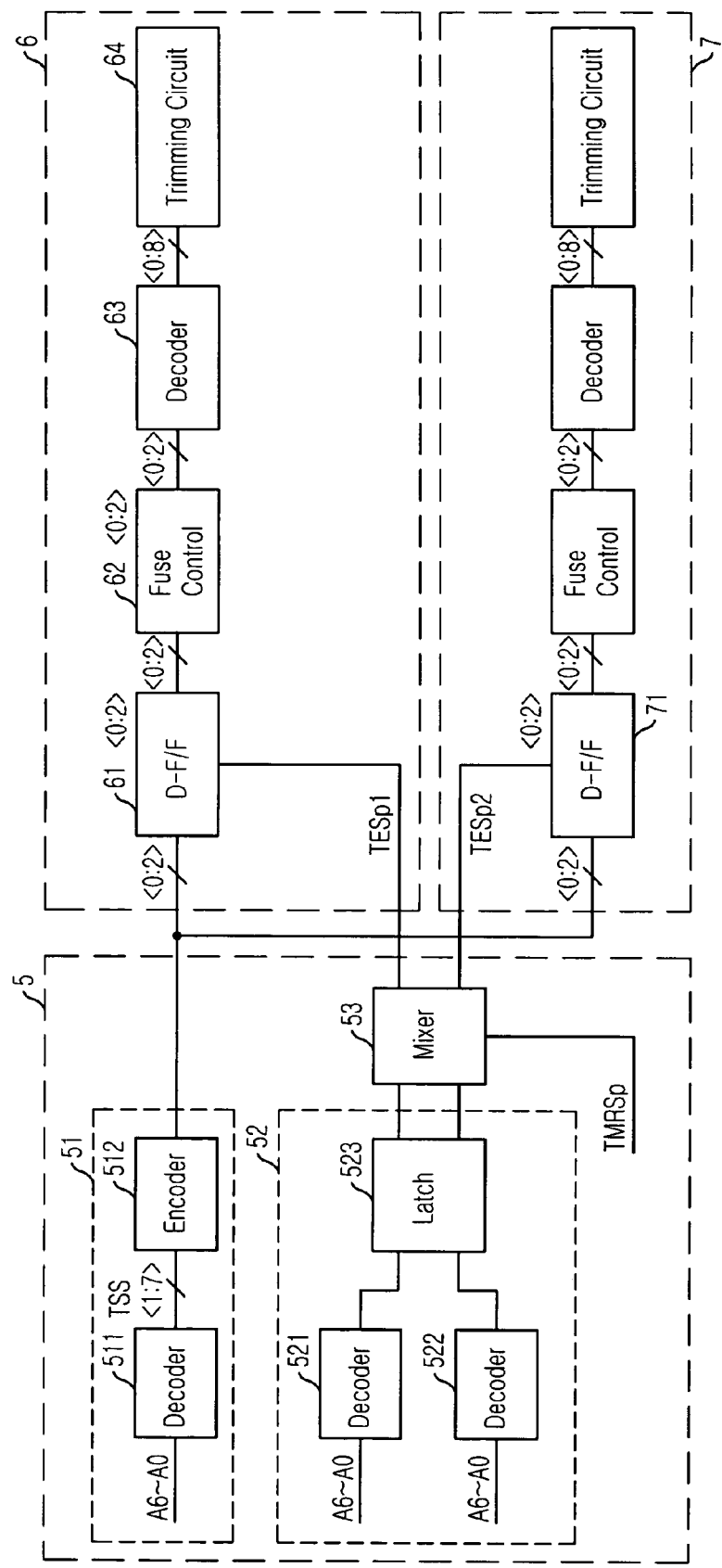
FIG. 4 is a block diagram showing an internal power voltage trimming technique in accordance with a preferred embodiment of the present invention.

FIG. 4 is a block diagram showing an internal power voltage trimming technique in accordance with a preferred embodiment of the present invention.

A trimming selection signal TSS is outputted from a trimming selection signal generating unit 51 to a plurality of internal power voltage level controlling units 6, 7. A latch 523 temporarily stores a first trimming enable signal TES1 and a second trimming enable signal TES2 that are outputted respective decoders 521, 522 to selectively output them. A mixer 53 outputs the first or second trimming enable signal TESp1, TESp2 that is selectively outputted under control of a command TMRSp that is inputted in test mode entry, to latching units 61, 71 in the internal power voltage level controlling units 6, 7. The latching unit 61 is controlled with the first trimming enable signal TESp1 to output a trimming selection signal TSS. On the other hand, a latching unit 71 is controlled with the second trimming enable signal TESp2 to output the trimming selection signal TSS. Here, latching units 61, 71 may be formed in various ways. For example, D F/F, S-R latch or dynamic latch can be used. In the present embodiment, the D F/F is used.

It will be described in detail for operation of detailed circuits that is exemplified according to the embodiment for performing such a function.

Figure 5:
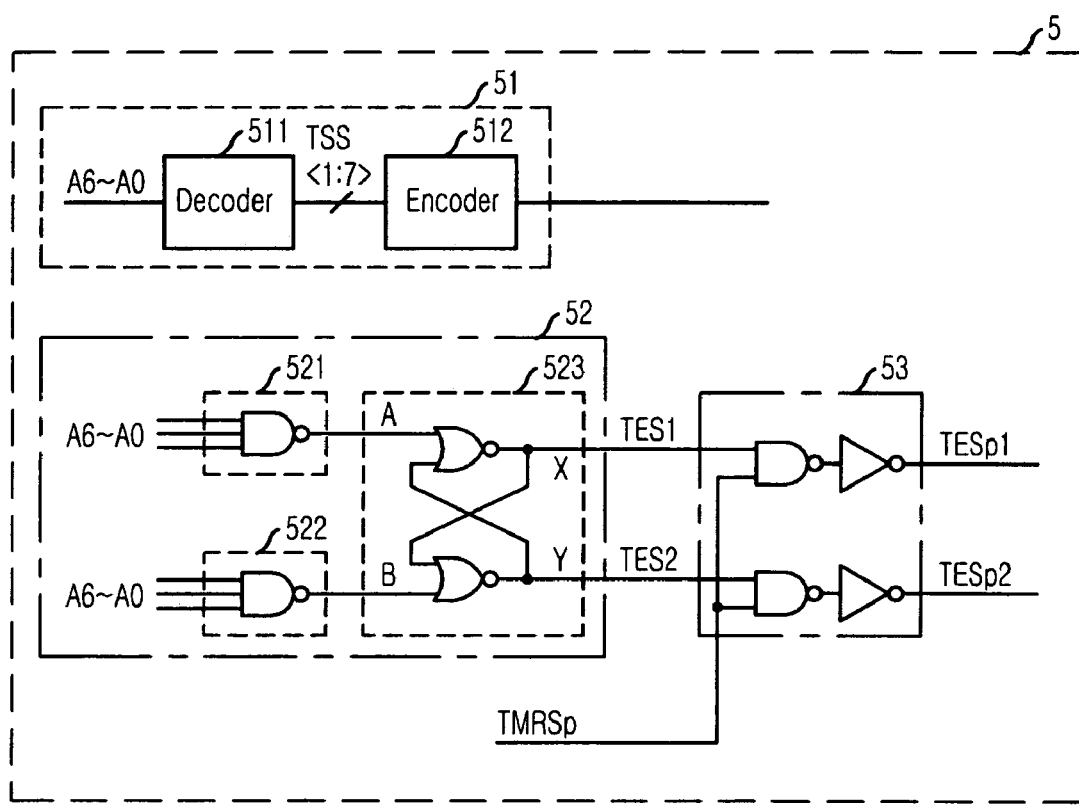
FIG. 5 is a detailed circuit diagram showing a trimming enable signal generating unit shown in FIG. 4.

FIG. 5 is a detailed circuit diagram showing the trimming enable signal generating unit 52 shown in FIG. 4.

The decoders 521, 522 in the trimming enable signal generating unit 52 may be formed with NAND gates. Each of the NAND gates 521, 522 is independently enabled receiving an address A6-A0. The outputs of the NAND gates 521, 522 are inputted to the set input and the reset input of a set-reset(S-R) NOR latch 523, respectively, so that the first trimming enable signal TES1 and the second trimming enable signal TES2 cannot be enabled simultaneously.

Here, the S-R NOR latch 523 operates as represented in the following Table 1.

TABLE 1

| A | B | X | Y |
|---|---|---|---|
| 0 | 0 | Maintain previous state | |
| 0 | 1 | 1 | 0 |
| 1 | 0 | 0 | 1 |
| 1 | 1 | 0 | 0 |

Figure 6:
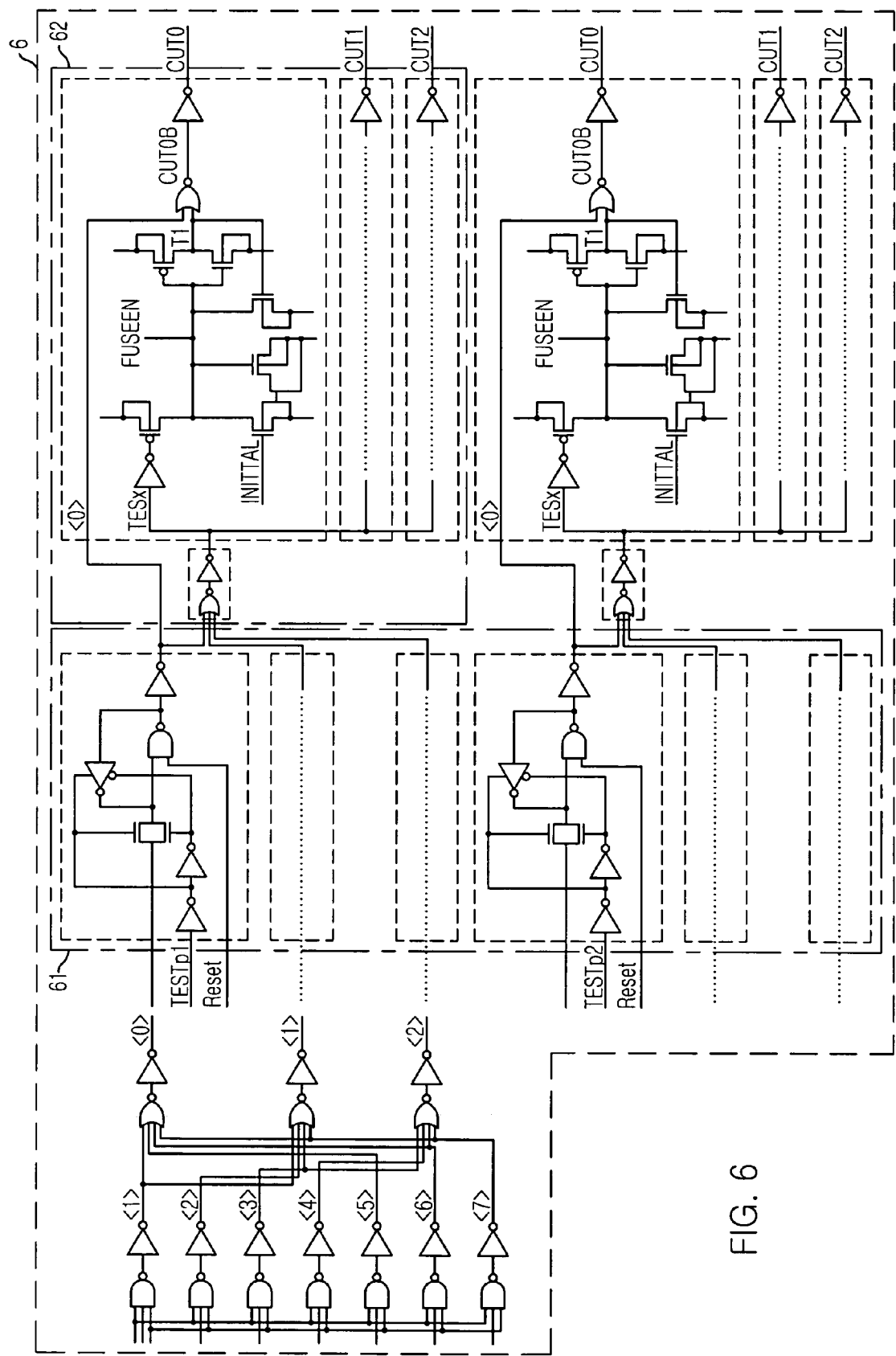
FIG. 6 is a detailed circuit diagram showing an internal power voltage level controlling unit shown in FIG. 4.

FIG. 6 is a detailed circuit diagram showing the internal power voltage level controlling unit 6 shown in FIG. 4.

A D F/F 61 transfers the first trimming enable signal TESp1 from the mixer 53 to output a fuse controlling unit 62 without regard to a logic signal of inputted data. Then, the fuse controlling unit 62 logically combines the output of the D F/F in an OR gate to confirm any trimming selection is made. Such a function is conventionally performed with the first trimming enable signal TES1 (or the second trimming enable signal TES2).

Since the first trimming enable signal TES1 (or the second trimming enable signal TS2 that is outputted from the latching unit 523 is a latched signal, there is no need to enable it continuously. If any trimming selection signal TSS is again selected so as to trim another voltage level, the D F/F 61 latches the output of the encoder 512 and transfers it to the fuse controlling unit 62. Here, if the D F/F is not reset, the first internal power voltage level is maintained in the previous trimming state. To disable this, it should be exit the test mode.

Further, according to such an operation, when the second trimming enable signal TES2 is enabled while the first internal power voltage level is selected, and any trimming selection signal TSS is enabled, the second internal power voltage level can be trimmed. At this point, the first internal power voltage is maintained. On the other hand, it is apparent to those skilled in the art that the second internal power voltage level can be first trimmed and then the first internal power voltage level can be trimmed.

Here, trimming state of the first and second internal power voltage levels that are level-trimmed in overlapped can be disabled with exiting the test mode.

As described above, optimal internal power voltage condition can be found by independently or substantially simultaneously trimming the levels of the plurality of the internal power voltages. Accordingly, yield can be improved. Further, since function test and DC test can be performed in one trimmed state, test time can be significantly reduced than when tested by separate trimming. Even, since overlapped trimming can be given in addition to independent level trimming, the function test can be performed without fuse cutting, without repetitively performing the function test after fuse cutting for each level of the internal power voltage.

The present application contains subject matter related to the Korean patent application No. KR 2004-75770, filled in the Korean Patent Office on Sep. 22, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal power voltage trimming circuit for use in an internal power voltage generating circuit, comprising:
   a trimming control signal generating means for decoding an inputted address signal to generate a trimming selection signal and trimming enable signals, including a trimming selection signal generator for generating the trimming selection signal for trimming the internal power voltage levels based on the inputted address signal and a trimming enable signal generator for generating the trimming enable signals for controlling transfer of the trimming selection signal by using the inputted address signal;
   a selection mixer for receiving the trimming enable signals and a test mode entry command from the trimming control signal generating means to selectively enable one of the trimming enable signals under control of the test mode entry command; and
   an internal power voltage level controlling means for receiving the trimming selection signal and the enabled trimming enable signal, the internal power voltage level controlling means including unit controllers, each unit controller controlling the levels of the internal power voltages based on the trimming selection signal and the enabled trimming enable signal,
   wherein the trimming selection signal generator includes a decoder for decoding the inputted address signal and an encoder for encoding an output signal from the decoder to generate the trimming selection signal and wherein one of unit controllers corresponding to the enabled trimming enable signal is enabled.

2. The internal power voltage trimming circuit as recited in claim 1, wherein the trimming enable signal generator includes:
   a plurality of decoders arranged in parallel for decoding the inputted address signal to output the trimming enable signals; and
   a latch unit for latching the trimming enable signals that are outputted from the plurality of decoders.

3. The internal power voltage trimming circuit as recited in claim 2, wherein the latch unit is formed with an a set-reset latch.

4. The internal power voltage trimming circuit as recited in claim 1, wherein each unit controller includes a latch unit for outputting the trimming selection signal under control of the corresponding trimming enable signal.

5. The internal power voltage trimming circuit as recited in claim 4, wherein the latch unit is formed with a D flip-flop.

6. The internal power voltage trimming circuit as recited in claim 4, wherein the latch unit is formed with a set-reset latch.

7. The internal power voltage trimming circuit as recited in claim 4, wherein the latch unit is formed with a dynamic latch.

8. The internal power voltage trimming circuit as recited in claim 3, wherein the decoder is formed with a NAND gate receiving the inputted address signal.

9. The internal power voltage trimming circuit as recited in claim 3, wherein the latch unit includes a first NOR gate and a second NOR gate,
   the first NOR gate receiving an output of the first decoder and an output of the second NOR gate and the second NOR gate receiving an output of the second decoder and an output of the first NOR gate.

10. The internal power voltage trimming circuit as recited in claim 9, wherein the selection mixer includes:
    a first NAND gate receiving the output of the first NOR gate and the test mode entry command; and
    a second NAND gate receiving the output of the second NOR gate and the test mode entry command.

11. An internal power voltage trimming circuit for use in an internal power voltage generating circuit, comprising:
    a trimming control signal generating means for decoding an inputted address signal to generate a trimming selection signal and trimming enable signals; and
    an internal power voltage level controlling means including unit controllers, each unit controller controlling the levels of the internal power voltages based on the trimming selection signal and a corresponding one of trimming enable signals;
    wherein one of the trimming enable signals is selectively enabled;
    wherein each unit controller includes a latch unit for outputting the trimming selection signal under control of the corresponding trimming enable signal and wherein the latch unit is formed with a set-reset latch.

12. The internal power voltage trimming circuit as recited in claim 11, wherein the trimming control signal generating means includes:
    a trimming selection signal generator for generating the trimming selection signal for trimming the internal power voltage levels based on the inputted address signal; and
    a trimming enable signal generator for generating the trimming enable signals for controlling transfer of the trimming selection signal by using the inputted address signal based on a test mode entry command.

13. The internal power voltage trimming circuit as recited in claim 12, wherein the trimming selection signal generator includes:
    a decoder for decoding the inputted address signal; and
    an encoder for encoding an output signal from the decoder to generate the trimming selection signal.

14. The internal power voltage trimming circuit as recited in claim 12, wherein the trimming enable signal generator includes:
    a plurality of decoders arranged in parallel for decoding the inputted address signal to output the trimming enable signals;
    a latch unit for selectively outputting the trimming enable signals that are outputted from the plurality of decoders; and
    a mixing unit for outputting the trimming enable signals from the latching means under control of the test mode entry command.

15. The internal power voltage trimming circuit as recited in claim 14, wherein the latch unit is formed with an a set-reset latch.

16. The internal power voltage trimming circuit as recited in claim 11, wherein the latch unit is formed with a D flip-flop.

17. The internal power voltage trimming circuit as recited in claim 11, wherein the latch unit is formed with a dynamic latch.

18. The internal power voltage trimming circuit as recited in claim 15, wherein the decoder is formed with a NAND gate receiving the inputted address signal.

19. The internal power voltage trimming circuit as recited in claim 15, wherein the latch unit includes a first NOR gate and a second NOR gate,
the first NOR gate receiving an output of the first decoder and an output of the second NOR gate and the second NOR gate receiving an output of the second decoder and an output of the first NOR gate.

20. The internal power voltage trimming circuit as recited in claim 19, wherein the mixing unit includes:
a first NAND gate receiving the output of the first NOR gate and the test mode entry command; and
a second NAND gate receiving the output of the second NOR gate and the test mode entry command.

21. An internal power voltage trimming circuit for use in an internal power voltage generating circuit, comprising:
a trimming control signal generating means for decoding an inputted address signal to generate a trimming selection signal and trimming enable signals,
wherein the trimming control signal generating means includes a trimming selection signal generator for generating the trimming selection signal for trimming the internal power voltage levels based on the inputted address signal and a trimming enable signal generator for generating the trimming enable signals for controlling transfer of the trimming selection signal by using the inputted address signal based on a test mode entry command,
wherein the trimming selection signal generator includes a plurality of decoders arranged in parallel for decoding the inputted address signal to output the trimming enable signals, a latch unit for selectively outputting the trimming enable signals that are outputted from the plurality of decoders, and a mixing unit for outputting the trimming enable signals from the latching means under control of the test mode entry command, and
wherein the latch unit is formed with a set-reset latch, and wherein the latch unit includes a first NOR gate and a second NOR gate, the first NOR gate receiving an output of the first decoder and an output of the second NOR gate and the second NOR gate receiving an output of the second decoder and an output of the first NOR gate; and
an internal power voltage level controlling means including unit controllers, each unit controller controlling the levels of the internal power voltages based on the trimming selection signal and a corresponding one of trimming enable signals, wherein one of the trimming enable signals is selectively enabled.

22. The internal power voltage trimming circuit as recited in claim 21, wherein the trimming selection signal generator includes:
a decoder for decoding the inputted address signal; and
an encoder for encoding an output signal from the decoder to generate the trimming selection signal.

23. The internal power voltage trimming circuit as recited in claim 21, wherein each unit controller includes a latch unit for outputting the trimming selection signal under control of the corresponding trimming enable signal.

24. The internal power voltage trimming circuit as recited in claim 23, wherein the latch unit is formed with a D flip-flop.

25. The internal power voltage trimming circuit as recited in claim 23, wherein the latch unit is formed with a set-reset latch.

26. The internal power voltage trimming circuit as recited in claim 23, wherein the latch unit is formed with a dynamic latch.

27. The internal power voltage trimming circuit as recited in claim 21, wherein the decoder is formed with a NAND gate receiving the inputted address signal.

28. The internal power voltage trimming circuit as recited in claim 21, wherein the mixing unit includes:
a first NAND gate receiving the output of the first NOR gate and the test mode entry command; and
a second NAND gate receiving the output of the second NOR gate and the test mode entry command.

* * * * *